(12) United States Patent
Wu et al.

(10) Patent No.: US 12,120,839 B2
(45) Date of Patent: Oct. 15, 2024

(54) CASING ASSEMBLY AND ELECTRONIC DEVICE INCLUDING THE SAME

(71) Applicant: WISTRON CORP., New Taipei (TW)

(72) Inventors: Long-Hua Wu, New Taipei (TW); Zhong-Hui Mao, New Taipei (TW); Chih Yao Chou, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 18/054,207

(22) Filed: Nov. 10, 2022

(65) Prior Publication Data

US 2023/0413468 A1 Dec. 21, 2023

(30) Foreign Application Priority Data

Jun. 21, 2022 (CN) .......................... 202210704099.8

(51) Int. Cl.
*H05K 7/14* (2006.01)
*H05K 7/18* (2006.01)

(52) U.S. Cl.
CPC ......... *H05K 7/1487* (2013.01); *H05K 7/1489* (2013.01); *H05K 7/183* (2013.01)

(58) Field of Classification Search
CPC ..................................................... H05K 5/00
See application file for complete search history.

(56) References Cited

U.S. PATENT DOCUMENTS

| 8,517,762 B1 | 8/2013 | Wang et al. |
| 2005/0183106 A1* | 8/2005 | Inoue ................... H05K 5/0221 720/646 |
| 2015/0189785 A1 | 7/2015 | Zhu |

FOREIGN PATENT DOCUMENTS

| CN | 109101091 A | 12/2018 |
| TW | 200933617 A | 8/2009 |
| TW | 201338682 A | 9/2013 |
| TW | 201401974 A | 1/2014 |

OTHER PUBLICATIONS

TW Office Action dated Feb. 15, 2023 in Taiwan application No. 111124661.

* cited by examiner

*Primary Examiner* — Jerry Wu
(74) *Attorney, Agent, or Firm* — McClure, Qualey & Rodack, LLP

(57) ABSTRACT

A casing assembly includes a frame, a support member, and an elastic holder, where the frame includes a frame bottom plate and a partition, the partition is disposed on the frame bottom plate and includes an engagement structure located at a side of the partition located away from the frame bottom plate, the support member is disposed on the frame bottom plate, and the elastic holder is disposed on the frame bottom plate and includes a holding structure movable with respect to the frame bottom plate.

17 Claims, 9 Drawing Sheets

CASING ASSEMBLY AND ELECTRONIC DEVICE INCLUDING THE SAME

CROSS-REFERENCE TO RELATED APPLICATIONS

This non-provisional application claims priority under 35 U.S.C. § 119(a) on Patent Application No(s). 202210704099.8 filed in China on Jun. 21, 2022, the entire contents of which are hereby incorporated by reference.

TECHNICAL FIELD

The disclosure relates to a retaining mechanism, more particularly relates to a casing assembly and an electronic device including the same for the installation and removal of a backplane.

BACKGROUND

In a server or computer casing, electronic components that have the same or similar functions are usually arranged in the same area for the facilitation of maintenance, installation, or removal works. Taking the hard disks management as an example, a server may require to accommodate a large number of hard disks to support large amount of data storage and exchange, to facilitate the related works, the hard disks are collectively arranged in a specific area of the server casing and all connected to the same backplane, thus the hard disks can have signal transmission with other elements (e.g., mainboard) in the server casing via the backplane. Generally, a server casing is compatible for at least two types of hard disks (e.g., 2.5-inch and 3.5-inch hard disks), thus the user may replace the hard disks with a selected group of hard disks as required.

The removal and installation of the hard disks involves the removal and installation of the backplane. However, conventionally, the backplane is fixed in place using screws or bolts, thus removing and installing the backplane result in troublesome works with the use of additional hand tool. Also, conventionally, the backplane is installed vertically, thus the space at the top of the backplane shall be large enough for the movement of the backplane, but which limits the design of nearby structures.

SUMMARY

Accordingly, one aspect of the disclosure is to provide a casing assembly and an electronic device including the same which are capable of solving the problems due to the conventional backplane installation.

One embodiment of the disclosure provides a casing assembly including a frame, a support member, and an elastic holder, the frame includes a frame bottom plate and a partition, the partition is disposed on the frame bottom plate and includes an engagement structure located at a side of the partition which is located away from the frame bottom plate, the support member is disposed on the frame bottom plate, and the elastic holder is disposed correspondingly to the support member on the frame bottom plate and includes a holding structure movable with respect to the frame bottom plate.

Another embodiment of the disclosure provides an electronic device, adapted for a backplane, including a chassis and a casing assembly, the casing assembly includes a frame, a support member, and an elastic holder, the frame includes a frame bottom plate and a partition, the frame bottom plate is disposed on the chassis, the partition is disposed on the frame bottom plate and includes an engagement structure located at a side of the partition which is located away from the frame bottom plate, the backplane is selectively adjoined to the engagement structure, the support member is disposed correspondingly to the support member on the frame bottom plate, and the elastic holder is disposed on the frame bottom plate and includes a holding structure movable with respect to the frame bottom plate.

According to the casing assembly and an electronic device including the same as discussed in the above embodiments of the disclosure, the side of the partition located away from the frame bottom plate has an engagement structure used to hold the backplane, and the frame bottom plate has a holding structure thereon also used to hold the backplane, such that the part of the backplane located away from the frame bottom plate and the part located close to the frame bottom plate can be fixed in place. As such, the installation of the backplane can be achieved.

Also, since the holding structure used to hold the part of the backplane located close to the frame bottom plate is movable with respect to the frame bottom plate, the installation of the backplane can be achieved by inclinedly placing the backplane to engage it to the engagement structure and then pivoting the backplane to engage with the holding structure. This ensures that the installation and removal of the backplane can be implemented when the space above the backplane is limited.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities. Unless specified or limited otherwise, the terms "mounted", "connected", "disposed", "fixed", and variations thereof are used broadly and encompass both direct and indirect mounting, connection, disposing, and fixing.

Figure 1:
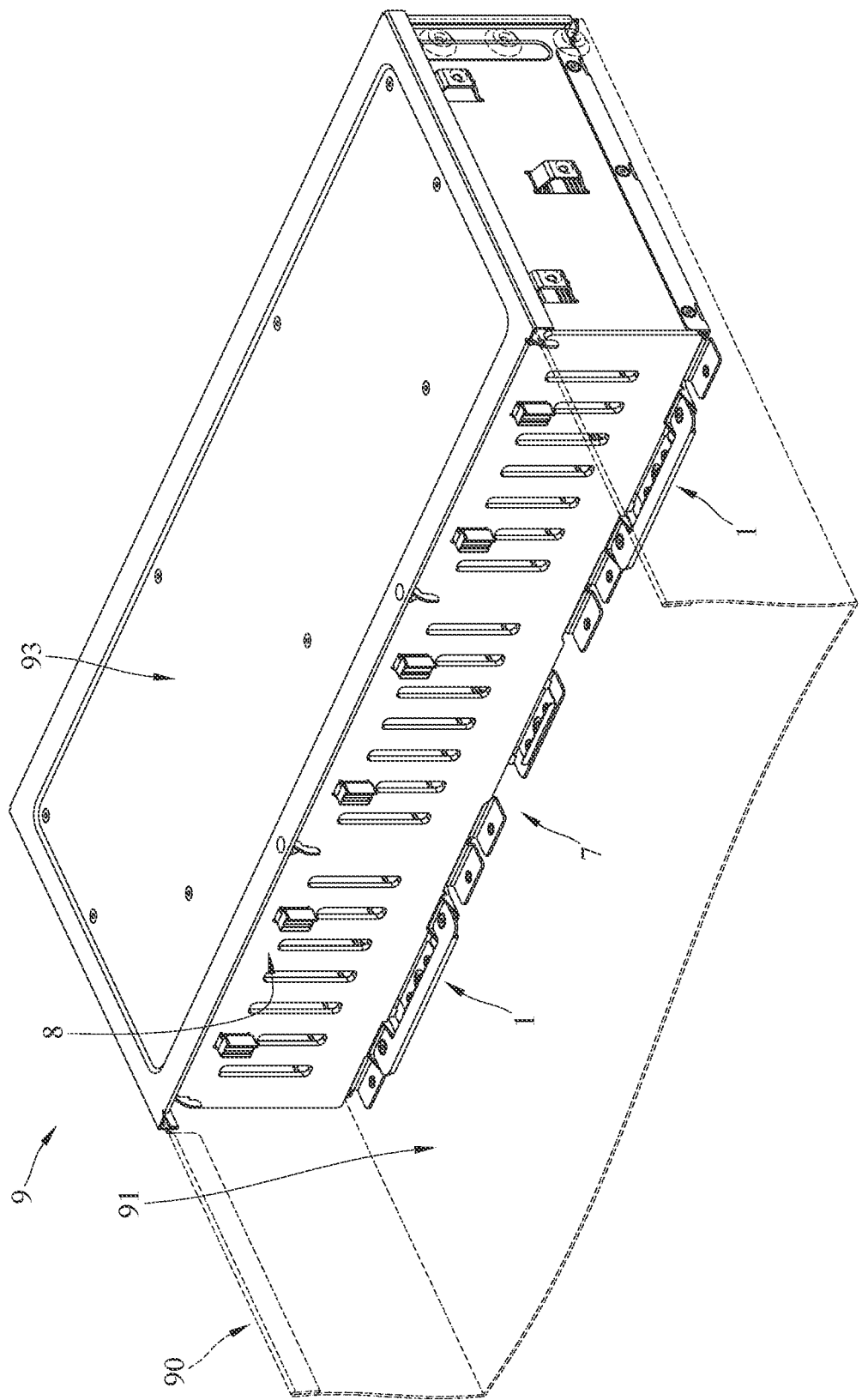
FIG. 1 is a partial perspective view of an electronic device according to one embodiment of the disclosure.

Referring to FIG. 1, one embodiment of the disclosure provides a casing assembly 7 and an electronic device 9 including the casing assembly 7. The electronic device 9 may be, but is not limited to, a computer host, server host, or any part thereof. The electronic device 9 may include a chassis 90 configured to support or accommodate one or more casing assemblies 7. The chassis 90 may also accommodate other electrical/non-electrical component, assembly, or module or casings as required. For example, there may be one or more retaining mechanisms 1 arranged on the casing assembly 7 and a backplane 8 selectively installed on the casing assembly 7, where the retaining mechanism 1 is able to secure the position of the backplane 8 on the casing assembly 7.

Figure 2:
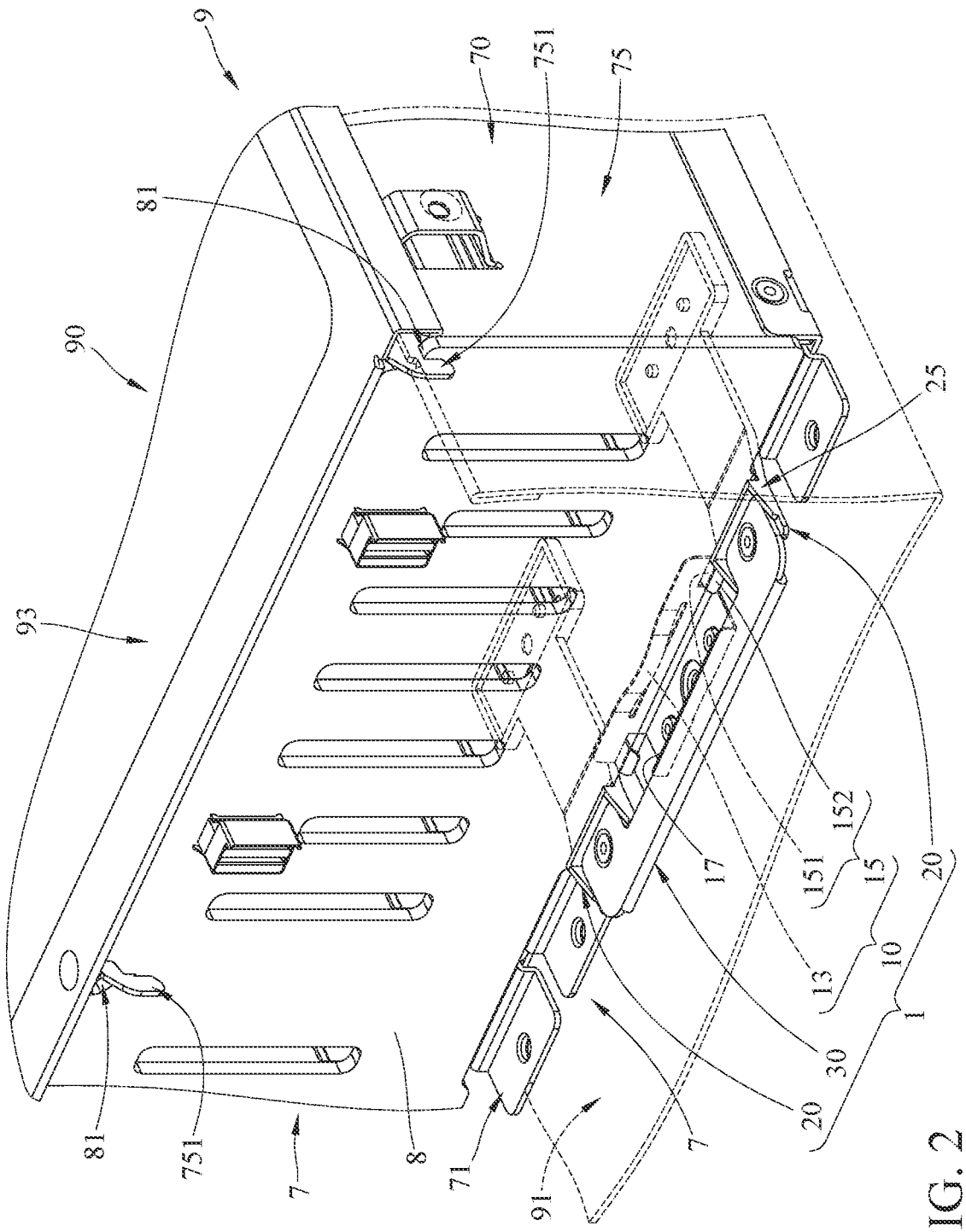
FIG. 2 is a partially enlarged view of FIG. 1.
Figure 3:
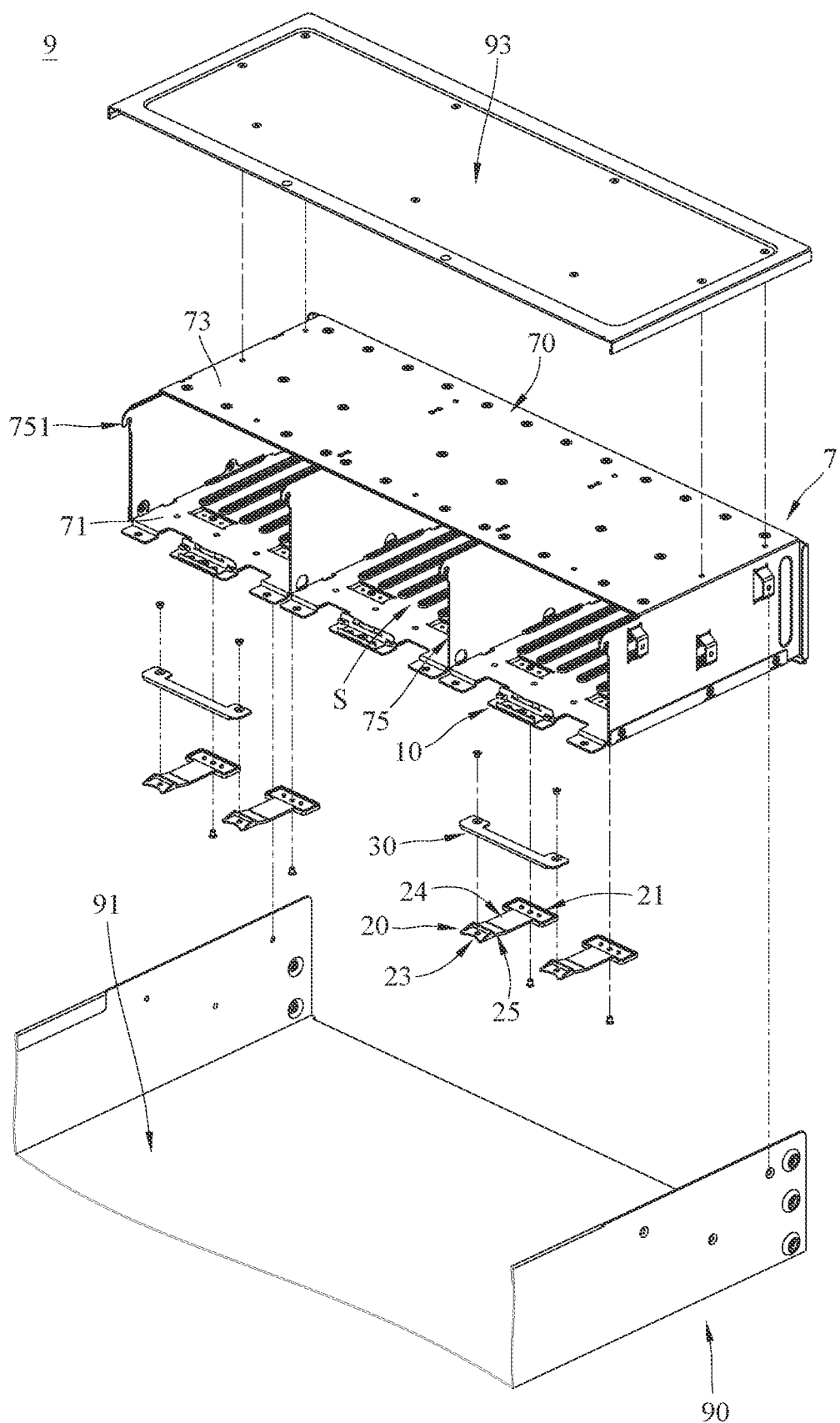
FIG. 3 is a partially enlarged exploded view of FIG. 1.
Figure 4:
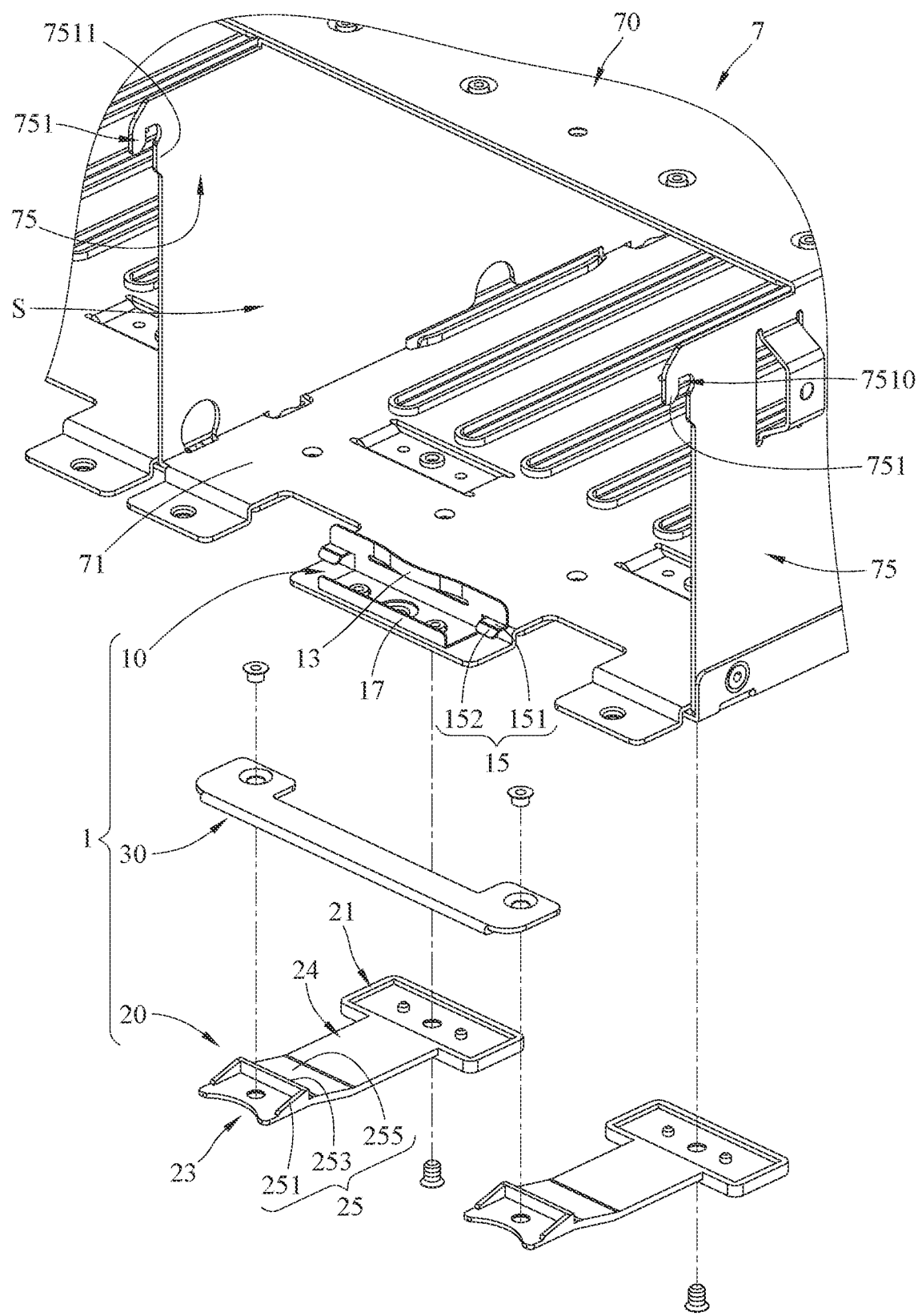
FIG. 4 is a partially enlarged view of FIG. 3.

Please further refer to FIGS. 2-4, in this embodiment, the chassis 90 may include a first plate portion 91 and a second plate portion 93. The first plate portion 91 may be, but is not limited to, the part of the chassis 90 used to support the casing assembly 7 in normal use; thus, the first plate portion 91 may also be called "chassis bottom plate 91" hereinafter. The casing assembly 7 may be disposed on the chassis bottom plate 91 using any suitable manner, such as welding, screws, or bolts. The second plate portion 93 may be, but is not limited to, the part of the chassis 90 located above the chassis bottom plate 91 and used to cover at least part of the casing assembly 7; thus, the second plate portion 93 may also be called "chassis cover plate 93" hereinafter.

In this embodiment, the casing assembly 7 may include a frame 70 suitable to be arranged between the chassis bottom plate 91 and the chassis cover plate 93. The frame 70 may include a frame bottom plate 71 and a frame top plate 73. The frame bottom plate 71 may be disposed on the chassis bottom plate 91 using any suitable manner, such as welding, screws, or bolts, but the disclosure is not limited thereto. In other embodiments, the frame bottom plate may be integrally formed with the chassis bottom plate. The retaining mechanism 1 may be disposed on the frame bottom plate 71 using any suitable manner, such as welding, screws, or bolts, but the disclosure is not limited thereto. The frame top plate 73 may be, but is not limited to, the part of the frame 70 located above the frame bottom plate 71 and located adjacent to the chassis cover plate 93 when in normal use. The backplane 8 may be disposed between the frame bottom plate 71 and the chassis cover plate 93, and the part of the backplane 8 located relatively close to the frame bottom plate 71 may be fixed in place by the retaining mechanism 1.

In this embodiment, the frame 70 of the casing assembly 7 may further include a plurality of partitions 75 standing on the frame bottom plate 71 and located between the frame bottom plate 71 and the frame top plate 73. The partitions 75 are spaced apart by any required distance, in such an arrangement, the frame bottom plate 71, the frame top plate 73, and the partitions 75 may together define a plurality of accommodation spaces S thereamong. The accommodation spaces S may be used to accommodate electrical components suitable to be connected to the backplane 8, such as hard disks (not shown). In some embodiments, there may be one or more electrical connectors (not numbered) on the side of the backplane 8 facing the accommodation space S for electrically connecting the electrical components in the accommodation spaces S, and there may be one or more electrical connectors (not numbered) on the side of the backplane 8 opposite to the accommodation space S for having electrical connection to other electrical components in the chassis 90. It is noted that the backplane 8 and its configuration are provided for better understanding the disclosure but are not intended to limit the disclosure.

The partitions 75 may each have an engagement structure 751. In some embodiments, the engagement structure 751 may be a hook located at a side of the partition 75 located relatively away from the frame bottom plate 71 (in other words, the engagement structure 751 may be a hook located at a side of the partition 75 located relatively close to the frame top plate 73), and the backplane 8 may have a plurality of slots 81(e.g., shown in FIG. 2) for receiving the engagement structures 751. The engagement structures 751 may be respectively engaged with the slots 81 so that the part of the backplane 8 located relatively close to the frame top plate 73 is fixed in place. As such, the engagement structures 751 of the partition 75 and the retaining mechanism 1 are able to respectively fix the positions of two opposite portions of the backplane 8 and therefore secure the position of the backplane 8 relative to the frame 70 or the chassis 90.

Optionally, the retaining mechanisms 1 may respectively correspond to accommodation spaces S, thus the retaining mechanisms 1 are able to stabilize the areas of the backplane 8 respectively having electrical components connected thereto, thereby securing the electrical connection between the backplane 8 and the electrical components thereon. It is noted that the quantities and configurations of the partitions 75 and the accommodation spaces S and the configuration and number of the electrical component that can be accommodated in the accommodation space S are all can be modified or changed as required, and the disclosure is not limited thereto.

The detail of the retaining mechanism 1 will be given below with further reference to FIG. 4. In this embodiment, the retaining mechanism 1 may include a support member 10, at least one elastic holder 20 and a handle member 30. The support member 10 may be an integrally formed single piece made of any suitable metal or plastic material. The support member 10 may be disposed on the frame bottom plate 71 of the casing assembly 7 using any suitable manner, such as welding, screws, or bolts, but the disclosure is not limited thereto. In some embodiments, the support member of the retaining mechanism may be integrally formed with the frame bottom plate of the casing assembly.

The elastic holder 20 may be an integrally formed single piece made of any suitable metal or plastic material. The elastic holder 20 may be disposed on the frame bottom plate 71 of the casing assembly 7 using any suitable manner, such as welding, screws, or bolts, but the disclosure is not limited thereto. In some embodiments, the elastic holder of the retaining mechanism may be integrally formed with the frame bottom plate of the casing assembly. As shown, the retaining mechanisms 1 may each include two elastic holders 20 respectively arranged adjacent to two opposite sides of the support member 10, but the disclosure is not limited thereto. In some other embodiments, the retaining mechanism may have only one or more than two elastic holders with any suitable distance to its support member.

The handle member 30 may be movably connected to the frame bottom plate 71 via the elastic holder 20. For example, the handle member 30 may be disposed on the end of the elastic holder 20 located away from the frame bottom plate 71 using any suitable manner, such as welding, screws, or bolts, but the disclosure is not limited thereto. In the retaining mechanism according to some other embodiments, the handle member may be integrally formed with the elastic holder. The elastic holder 20 may be elastically deformed by being forced by the handle member 30. In some other embodiments, the retaining mechanism may omit the handle member and the retaining mechanism may be operated by directly pressing the elastic holder.

In this embodiment, the support member 10 may include an elastic pushing structure 13, at least one supporting structure 15, and a stopping structure 17. The elastic pushing structure 13 has a convex shape protruding towards away from the accommodation space S when no external force is applied thereto. The supporting structure 15 is located above the frame bottom plate 71. The supporting structure 15 is able to support the backplane 8 when in a specific situation that will be described in FIG. 8 in later paragraphs. In this embodiment, the support member 10 may include two supporting structures 15, and the supporting structures 15 may be respectively located at or adjacent to two opposite sides of the elastic pushing structure 13, but the disclosure is not limited thereto. In some other embodiments, the support member may only have one supporting structure at one side of the elastic pushing structure or have a plurality of supporting structures at one side of the elastic pushing structure.

In this embodiment, the supporting structures 15 may each include a supporting surface 151 and an inclined surface 152, the supporting surface 151 may be a flat surface substantially parallel to the frame bottom plate 71, and the inclined surface 152 is connected to a side of the supporting surface 151 located away from the accommodation space S and is inclined relatively to the supporting surface 151. Specifically, the inclined surface 152 may be a slope inclined towards the frame bottom plate 71 from the supporting surface 151. The stopping structure 17 may be located at a side of the support member 10 located away from the elastic pushing structure 13. Specifically, the stopping structure 17 may be a plate substantially perpendicular to the frame bottom plate 71 and located opposite to the elastic pushing structure 13.

The elastic holder 20 may include a fixed end 21, a free end 23, and an elastic arm portion 24. The elastic holder 20 is fixed to the frame bottom plate 71 via the fixed end 21. In other embodiments, the fixed end of the elastic holder may be integrally formed with the frame bottom plate. The free end 23 is located opposite to the fixed end 21. The handle member 30 may be fixed to the elastic holder 20 via the free end 23. The elastic arm portion 24 is the part of the elastic holder 20 between the fixed end 21 and the free end 23. When external force is applied to the free end 23, the elastic arm portion 24 responses to the force and therefore is elastically deformed so that the free end 23 is moved relatively to the fixed end 21.

Figure 7:
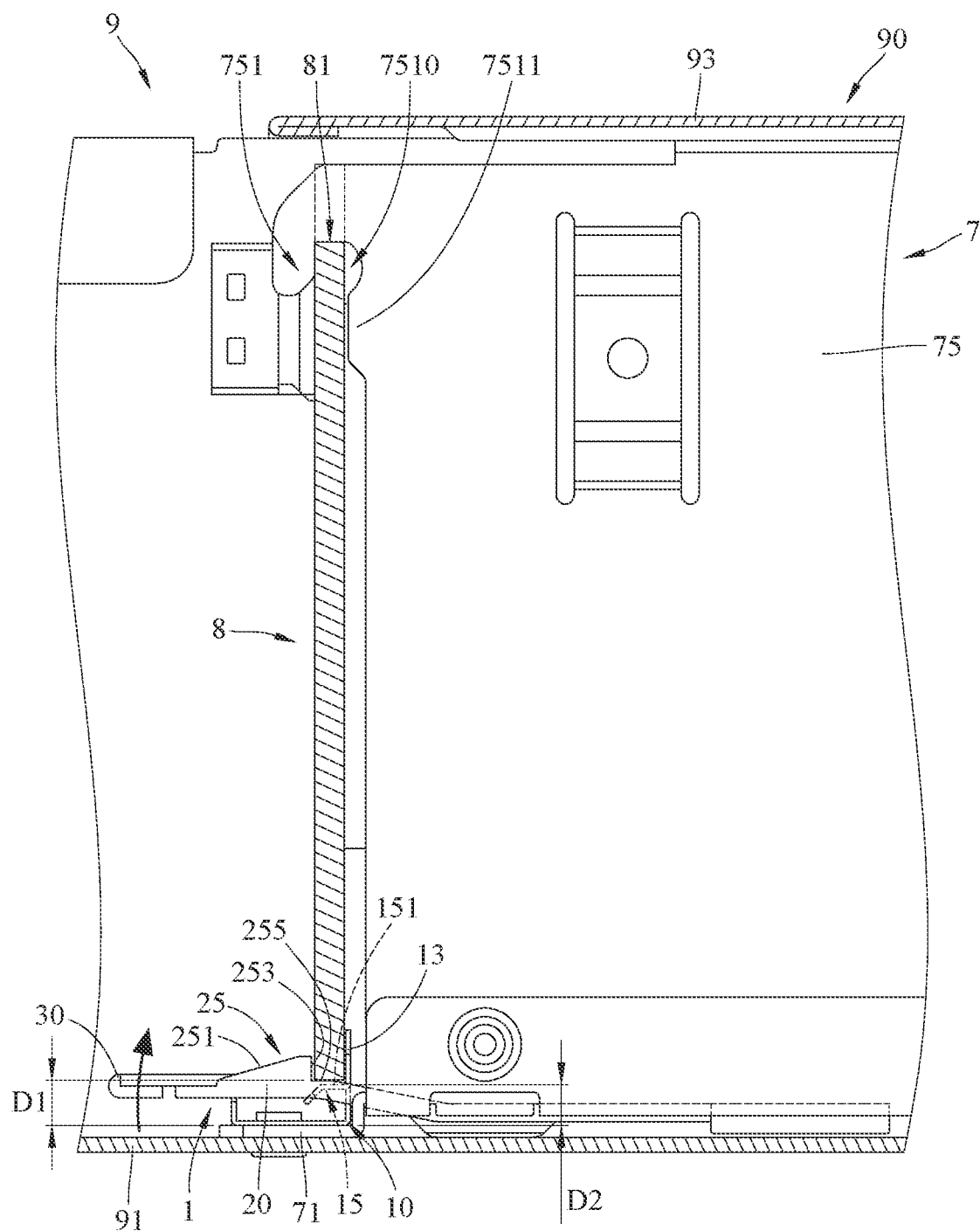
Figure 8:
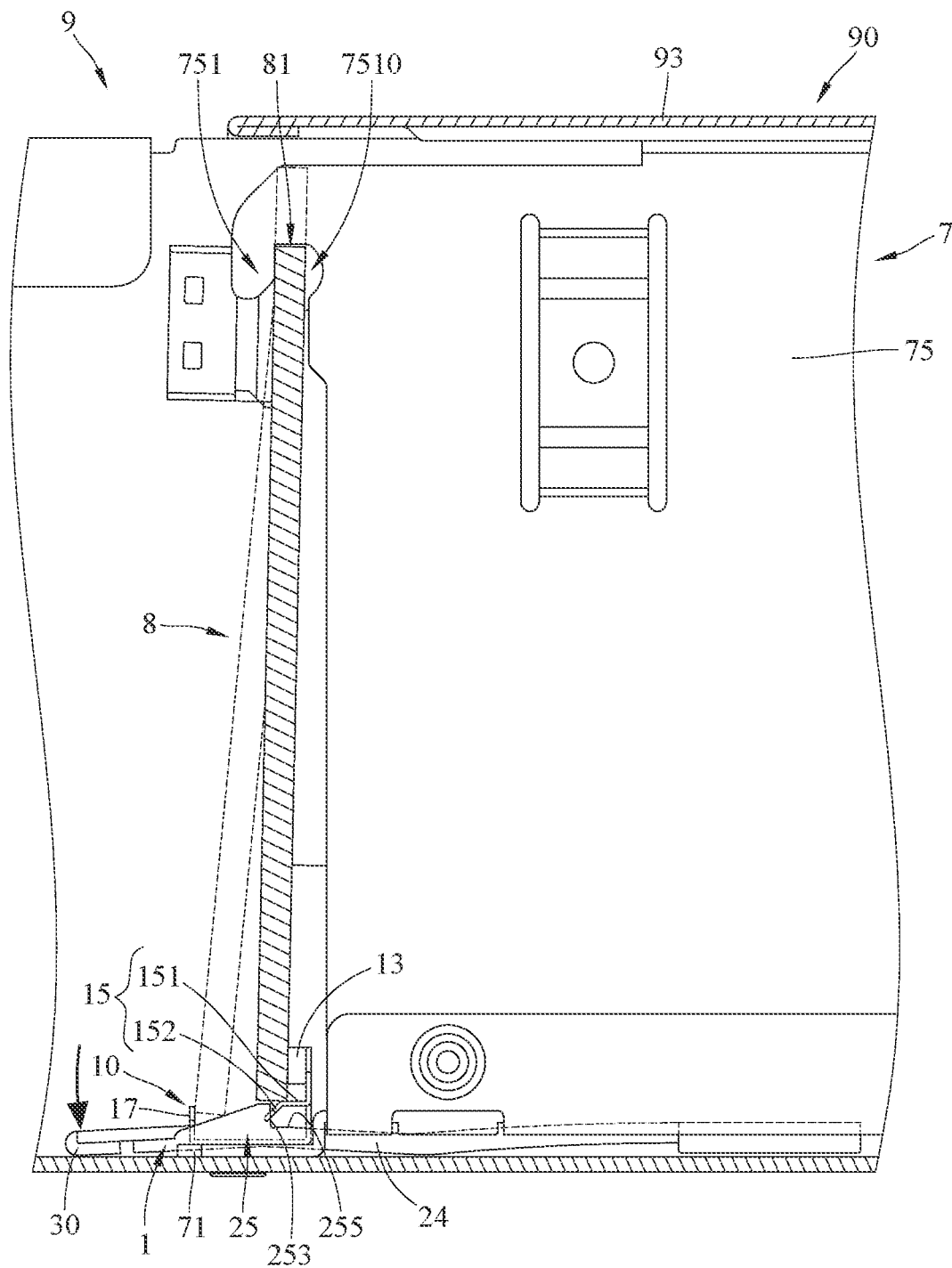
FIG. 8 depicts the removal of the backplane from an electronic device including a retaining mechanism according to one embodiment of the disclosure.

The elastic holder 20 may further include a holding structure 25, the holding structure 25 may be arranged at an area of the elastic holder 20 located relatively away from the fixed end 21. For example, the holding structure 25 may be located at the free end 23 or located at an area of the elastic arm portion 24 located relatively close to the free end 23. Thus, the holding structure 25 is movably connected to the frame bottom plate 71 via the elastic arm portion 24. Herein, the holding structure 25 is movable between a holding position (as shown in FIG. 2 or FIG. 7) and a releasing position (as shown in FIG. 8) relative to, for example, the elastic pushing structure 13 of the support member 10. When there is no external force applied to the elastic arm portion 24, the holding structure 25 stays in the holding position; when an external force is applied to make the elastic arm portion 24 elastically deformed, the holding structure 25 is switched to the releasing position; when the external force is canceled, the elastic arm portion 24 elastically restores to its original shape so that the holding structure 25 returns to the holding position.

In this embodiment, the holding structure 25 may include a contacting surface 251 and a stopping surface 253. The contacting surface 251 may be an inclined surface located at or located adjacent to the free end 23, in other words, the contacting surface 251 may be a surface located at a side of the holding structure 25 located away from the elastic pushing structure 13 of the support member 10 and is inclined relatively to the frame bottom plate 71. The stopping surface 253 may be a vertical surface at an acute angle to the contacting surface 251. Specifically, the contacting surface 251 and the stopping surface 253 may be located opposite to each other, the contacting surface 251 may be a slope inclined towards the chassis bottom plate 91 or the frame bottom plate 71, and the stopping surface 253 may be a vertical surface substantially facing towards the accommodation space S or the elastic pushing structure 13 of the support member 10. Optionally, when the holding structure 25 is in the holding position, the stopping surface 253 may be substantially perpendicular to the frame bottom plate 71. In addition, in this embodiment, the holding structure 25 may further include a pushing surface 255 connected to the end of the stopping surface 253 located opposite to the contacting surface 251. The pushing surface 255 may be inclined relatively to or substantially parallel to the frame bottom plate 71.

Figure 5:
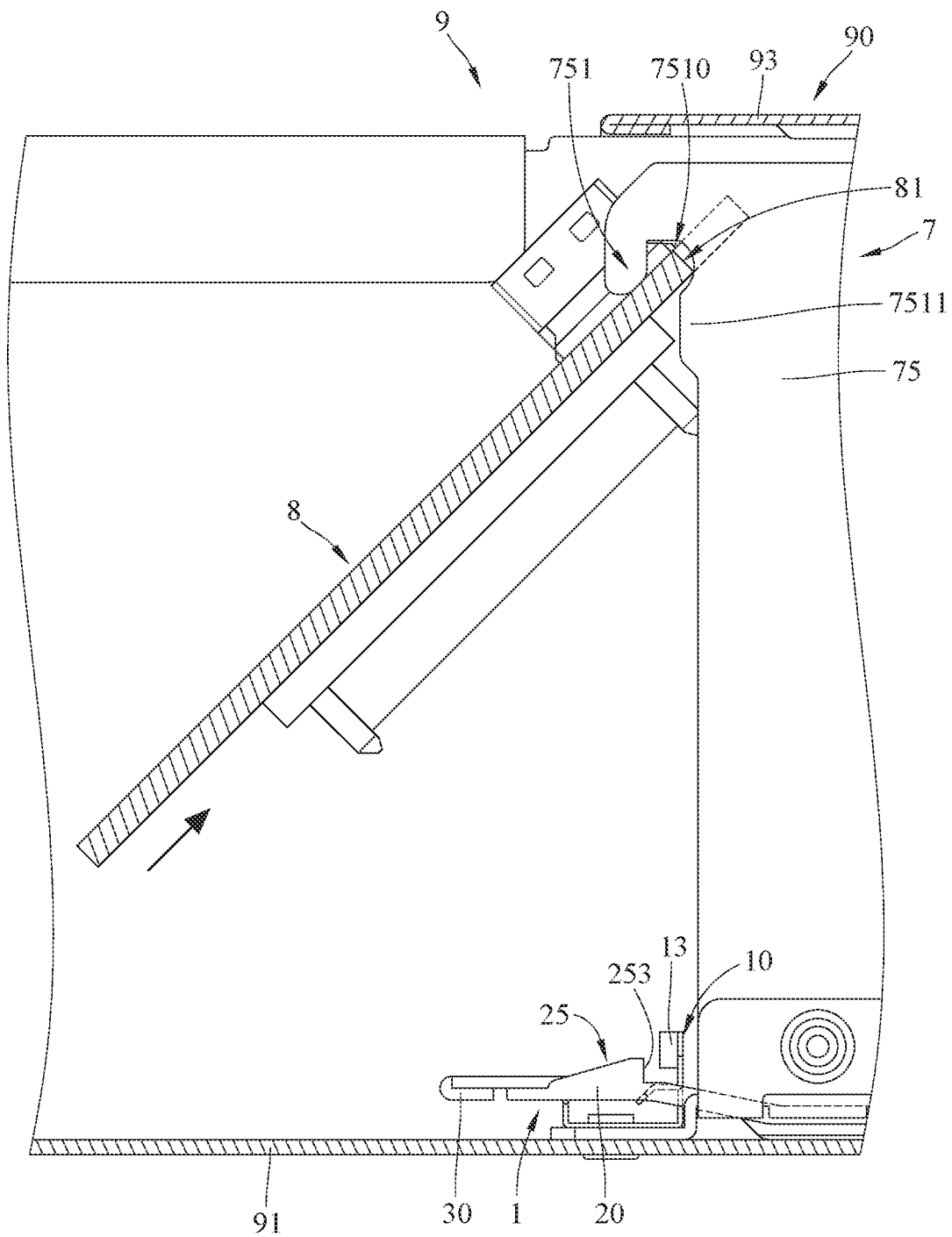
FIGS. 5-7 depict the installation of a backplane using an electronic device including a retaining mechanism according to one embodiment of the disclosure.

Then, the installation of the backplane 8 onto the casing assembly 7 will be described with reference to FIGS. 5-7. Firstly, as shown in FIG. 5, the backplane 8 may be moved towards the engagement structure 751 of the partition 75 located adjacent to the chassis cover plate 93 of the chassis 90 in an inclined manner as indicated by the arrow. To do so, the slots 81 on the backplane 8 may be firstly aligned with the engagement structures 751 of the partitions 75 so that the backplane 8 is able to be selectively adjoined to the engagement structures 751. As shown, the space defined by the engagement structure 751 may have a recess 7510 at a side thereof to avoid the backplane 8 from having physical interference with the partitions 75 or the engagement structures 751 during the installation and removal of the backplane 8. In addition, as shown, before the backplane 8 contacts the retaining mechanism 1, the elastic holder 20 is not yet affected by external force and therefore its holding structure 25 is in the holding position, and the stopping surface 253 of the holding structure 25 may correspond to or face toward the elastic pushing structure 13 of the support member 10.

Figure 6:
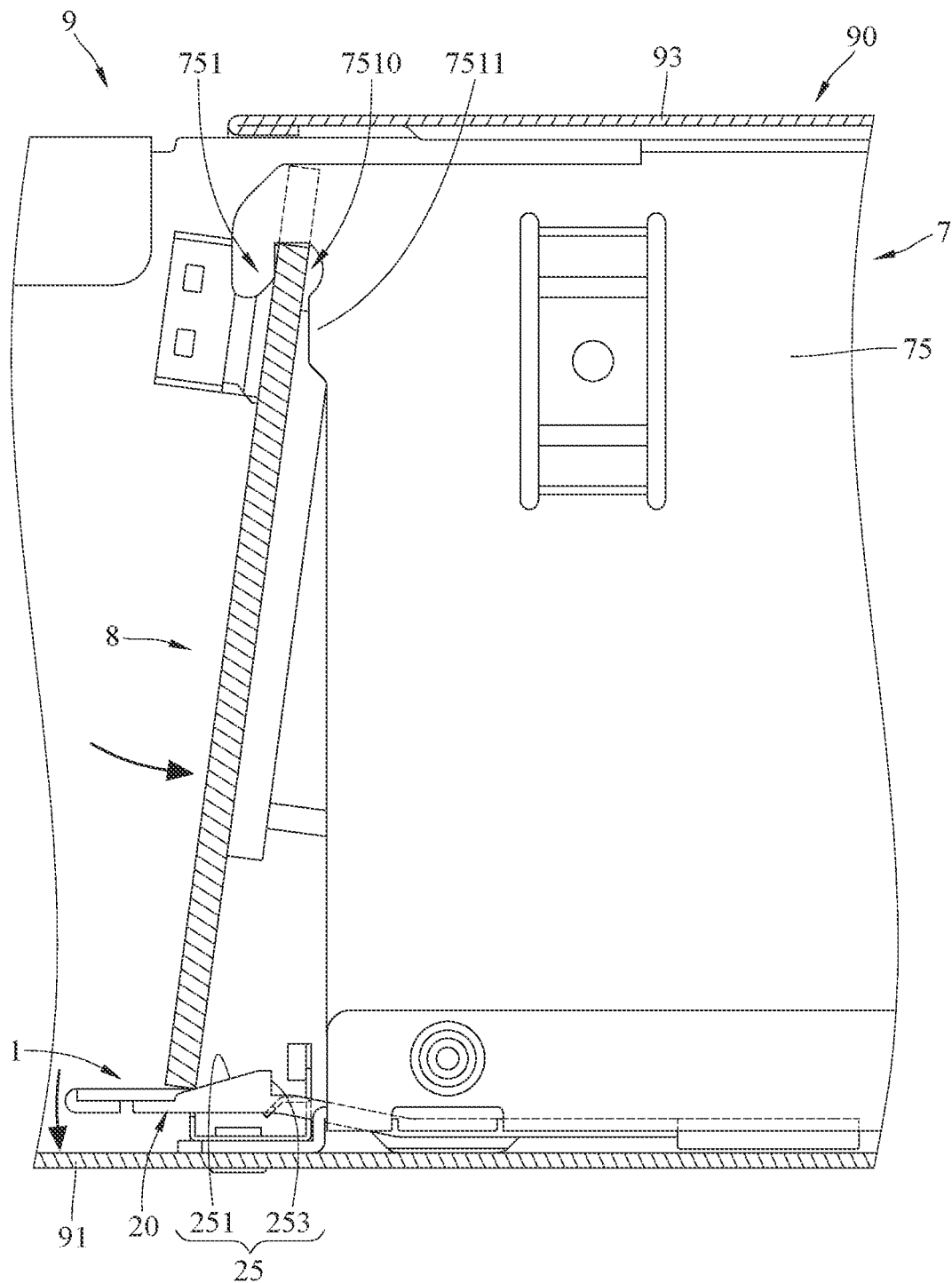

Then, in FIG. 6, the backplane 8 is pivoted relatively to the frame 70 of the casing assembly 7 as indicated by the arrow when one end thereof abuts the engagement structure 751. As shown, when the holding structure 25 is in the holding position, the contacting surface 251 of the holding structure 25 is located at the path of the backplane 8, thus the part of the backplane 8 located away from the engagement structure 751 will push the contacting surface 251. Since the contacting surface 251 is an inclined surface, the push of the backplane 8 to the contacting surface 251 may cause the elastic arm portion 24 to elastically deform as indicated by the arrow so as to force the holding structure 25 to move towards the releasing position.

Referring to FIGS. 6 and 7, the holding structure 25 is switched to the releasing position from the holding position, the stopping surface 253 of the holding structure 25 is moved to a position horizontally not corresponding to the elastic pushing structure 13 of the support member 10 so as to allow the backplane 8 to slide from one side of the contacting surface 251 to another. In FIG. 7, as the backplane 8 reaches the top of the stopping surface 253, the elastic arm portion 24 instantly elastically restores to its original shape to bring the holding structure 25 back to the holding position. As such, the stopping surface 253 of the holding structure 25 stops at a side of the backplane 8 opposite to the accommodation space S and therefore restrict the backplane 8 from moving away from the accommodation space S. Meanwhile, the stopping surface 253 also can force the backplane 8 to push the elastic pushing structure 13 of the support member 10 so as to make the elastic pushing structure 13 elastically deformed. Thus, the backplane 8 can be in tight contact with the stopping surface 253 by being forced by the elastic pushing structure 13. In other words, the part of the backplane 8 located away from the engagement structure 751 is clamped by the elastic pushing structure 13 of the support member 10 and the stopping surface 253 of the elastic holder 20.

Also, in FIG. 7, when the holding structure 25 is in the holding position, the pushing surface 255 of the holding structure 25 may be located further away from the frame bottom plate 71 of the casing assembly 7 than the supporting surface 151 of the support member 10; in other words, the supporting surface 151 is located lower than the pushing surface 255 when the holding structure 25 is in the holding position. Specifically, as shown, the pushing surface 255 of the holding structure 25 and the frame bottom plate 71 of the casing assembly 7 is spaced apart by a distance of D1 while the supporting surface 151 of the support member 10 and the frame bottom plate 71 of the casing assembly 7 is spaced apart by a distance of D2, and D1>D2. It is noted that the distances D1 and D2, in the view angle of the drawings, can be considered as vertical distances. As such, the pushing surface 255 is able to apply a force towards the engagement structure 751 of the partition 75 to the backplane 8 so as to increase the engagement between the slots 81 of the backplane 8 and the engagement structures 751. Optionally, in this embodiment, the partition 75 may have a convex structure 7511 arranged at the edge of the partition 75 located adjacent to the recess 7510, and the convex structure 7511 is able to support the backplane 8 when the backplane 8 is installed in position.

As such, in FIG. 7, the engagement structure 751 of the partition 75 which is cooperated with the slot 81 of the backplane 8, the convex structure 7511 of the partition 75, the stopping surface 253 and the pushing surface 255 of the holding structure 25, and the elastic pushing structure 13 of the support member 10 may together retain the top, bottom, left, right, front, and back sides of the backplane 8 and therefore limit the backplane 8 from moving in all directions, and thereby securing the installation stability of the backplane 8 and the electrical connection between the backplane 8 and the electrical component connected thereto.

The removal of the backplane 8 will be described with reference to FIG. 8. To remove the backplane 8, first step may be pressing the handle member 30 or directly pressing the elastic holder 20 as indicated by the arrow, by doing so, the elastic arm portion 24 is elastically deformed to make the holding structure 25 switch to the releasing position. When the holding structure 25 is moved to the releasing position, the stopping surface 253 and the pushing surface 255 of the holding structure 25 are moved away from the backplane 8, thus the elastic pushing structure 13 is free to return to its original shape so as to apply a force away from the accommodation space S to the backplane 8. Specifically, the release of the elastic pushing structure 13 pushes the part of the backplane 8 located close to the frame bottom plate 71 away from the partition 75. Meanwhile, although the backplane 8 is not supported by the pushing surface 255, the supporting surface 151 still can timely support the backplane 8 to prevent the backplane 8 from falling off from the support member 10 and prevent any unwanted hitting to the backplane 8; that is, the backplane 8 is selectively and movably disposed on the supporting surface 151 and therefore is prevented from falling off from the support member 10.

In some embodiments, when the elastic pushing structure 13 pushes the part of the backplane 8 located relatively close to the frame bottom plate 71 off the supporting surface 151, the backplane 8 may slide towards the stopping structure 17 by being guided by the inclined surface 152. As can be seen in the backplane 8 in dashed-lines, the stopping structure 17 stops the backplane 8 from moving further away from the frame 70, and thus the backplane 8 which is not retained by the elastic holder 20 can be temporarily in a freely removable status for user. Then, the backplane 8 is free to be removed by the user and thereby completing the removal of the backplane 8.

As discussed, due to the retaining mechanism 1, the backplane 8 can be easily installed to be vertical by simple steps, such as inclinedly placing and then pivoting the backplane 8. Also, due to the retaining mechanism 1, simply pressing the handle member 30 can make the backplane 8 automatically return to inclined position for removal. As such, the retaining mechanism 1 enables an efficient and toolless installation and removal of the backplane 8 and thus improving the efficiency in maintenance works related to the backplane 8.

In addition, since the backplane 8 is installed and removed in an inclined manner, the installation and removal of the backplane 8 will not be affected by the chassis cover plate 93 even if the chassis cover plate 93 in some embodiments may completely cover the top of the backplane 8 and limit the movement of the backplane 8 in vertical direction.

Figure 9:
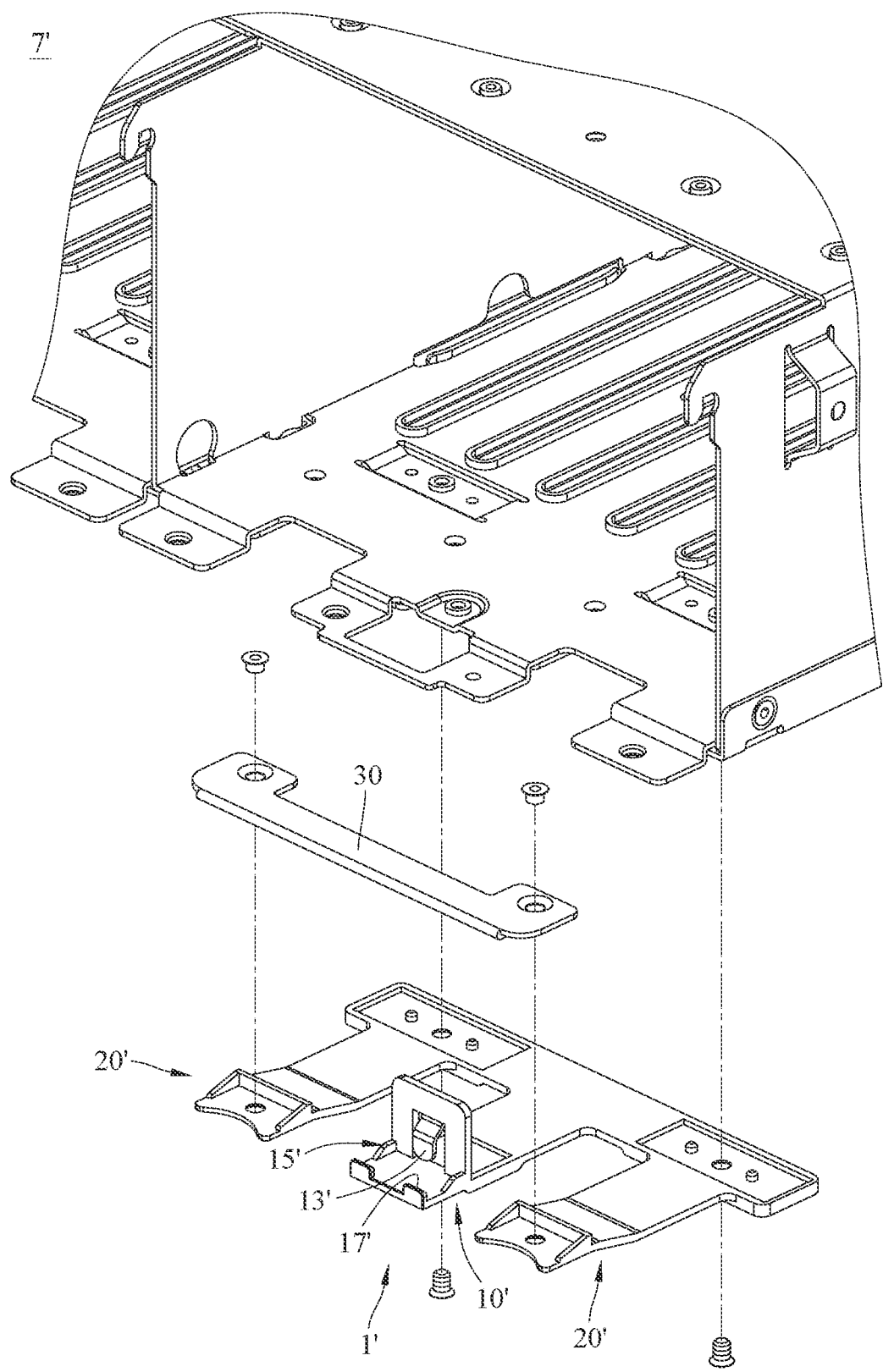
FIG. 9 is a partially enlarged exploded view of a casing assembly including a retaining mechanism according to another embodiment of the disclosure.

It is noted that the previous retaining mechanism is one of exemplary embodiments but is not intended to limit the disclosure. Any required modification based on the spirit reflected by the previous embodiments may be applied to the retaining mechanism of the disclosure. For example, please see FIG. 9, another embodiment of the disclosure provides a retaining mechanism 1' and a casing assembly 7' including the same, but for the purpose of simplicity, only the main differences between the introduced embodiment and the previous embodiments will be described in detail. It is also noted that the same reference number denote the same component or element.

As shown, in the retaining mechanism 1', elastic holders 20' are integrally formed with a support member 10', an elastic pushing structure 13' may be a bent tab integrally formed on the support member 10', supporting structures 15' may also be served as ribs between the plates of the support member 10', and a stopping structure 17' may have two bent parts spaced apart from each other. Such an arrangement of the retaining mechanism 1' also can enable a backplane to be installed and removed in an efficient and toolless manner.

It is noted that the retaining mechanism of the disclosure may be further modified as required. In some other embodiments, the retaining mechanism may omit the handle member; in this case, the retaining mechanism is operated by directly pressing the elastic holder. Alternatively, in another embodiment, there may only one retaining mechanism disposed on the chassis bottom plate. Alternatively, in another embodiment, all the elastic holders on the chassis may be connected to the same handle member. Alternatively, in another embodiment, the retaining mechanisms on the chassis bottom plate may be integrally formed into a single piece. Alternatively, in another embodiment, the support member may omit the elastic pushing structure.

According to the casing assembly and an electronic device including the same as discussed in the above embodiments of the disclosure, the side of the partition located away from the frame bottom plate has an engagement structure used to hold the backplane, and the frame bottom plate has a holding structure thereon also used to hold the backplane, such that the part of the backplane located away from the frame bottom plate and the part located close to the frame bottom plate can be fixed in place. As such, the installation of the backplane can be achieved without involving use of additional hand tool.

Also, since the holding structure used to hold the part of the backplane located close to the frame bottom plate is movable with respect to the frame bottom plate, the installation of the backplane can be achieved by inclinedly placing the backplane to engage it to the engagement structure and then pivoting the backplane to engage with the holding structure. This ensures that the installation and removal of the backplane can be implemented when the space above the backplane is limited.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A casing assembly, comprising:
a frame comprising a frame bottom plate, a frame top plate and a partition, wherein the frame top plate is located above the frame bottom plate, the partition is disposed on the frame bottom plate and comprises an engagement structure located at a side of the partition which is located away from the frame bottom plate, and wherein the partition is a plate disposed between the frame top plate and the frame bottom plate, and the engagement structure is located on top of the partition; a support member disposed on the frame bottom plate; and an elastic holder disposed correspondingly to the support member on the frame bottom plate and comprising a holding structure movable with respect to the frame bottom plate; and the support member further comprises a supporting structure, and the supporting structure comprises a supporting surface located above the frame bottom plate, and a backplane is selectively and movably disposed on the supporting surface; and the elastic holder further comprises an elastic arm portion, the holding structure is movably connected to the frame bottom plate via the elastic arm portion, the holding structure comprises a pushing surface, wherein the frame bottom plate has a first top surface and a second top surface facing a same direction, the partition is disposed on the first top surface of the frame bottom plate, the second top surface of the frame bottom plate is located farther away from the partition than the first top surface, when the holding structure is in a holding position, a distance between the pushing surface of the elastic holder and the second top surface of the frame bottom is D1, a distance between the supporting surface of the support member and the second top surface of the frame bottom is D2, D1>D2, and the backplane is selectively adjoined to the engagement structure of the partition.

2. The casing assembly according to claim 1, wherein the supporting structure further comprises an inclined surface which is connected to the supporting surface and is inclined relatively to the supporting surface.

3. The casing assembly according to claim 2, wherein the support member further comprises a stopping structure located at a side of the support member which is located away from an elastic pushing structure of the support member, and the backplane is adjoined the stopping structure selectively.

4. The casing assembly according to claim 1, wherein the elastic holder further comprises an elastic arm portion, and the holding structure is movably connected to the frame bottom plate via the elastic arm portion.

5. The casing assembly according to claim 4, wherein the holding structure of the elastic holder comprises a stopping surface facing towards an elastic pushing structure of the support member, and a backplane is located between the stopping surface and the elastic pushing structure selectively.

6. The casing assembly according to claim 4, wherein the holding structure of the elastic holder comprises a contacting surface located at a side of the holding structure which is located away from an elastic pushing structure of the support member and is inclined relatively to the frame bottom plate.

7. The casing assembly according to claim 1, further comprising a handle member movably connected to the frame bottom plate via the elastic holder.

8. The casing assembly according to claim 1, wherein the elastic holder is integrally formed with the support member.

9. An electronic device, adapted for a backplane, comprising:
a chassis; and
a casing assembly comprising:
a frame comprising a frame bottom plate and a partition, wherein the frame bottom plate is disposed on the chassis, the partition is disposed on the frame bottom plate and comprises an engagement structure, and the engagement structure is located at a side of the partition which is located away from the frame bottom plate, and the backplane is selectively adjoined to the engagement structure;
a support member disposed on the frame bottom plate; and
an elastic holder disposed correspondingly to the support member on the frame bottom plate and comprising an elastic arm portion and a holding structure movable with respect to the frame bottom plate through the elastic arm portion; wherein the support member further comprises a supporting structure, and the supporting structure comprises a supporting surface and an inclined surface, the supporting surface is located above the frame bottom plate, and the inclined surface is connected to the supporting surface and is inclined relatively to the supporting surface; and a push of the backplane to the inclined surface causes the elastic arm portion to deform.

10. The electronic device according to claim 9, wherein the holding structure is movable between a holding position and a releasing position, when the holding structure is in the holding position, the backplane is adjoined between the holding structure and the elastic pushing structure of the support member; when the holding structure is in the releasing position, a part of the backplane is moved away from the frame and the elastic pushing structure of the support member.

11. The electronic device according to claim 9, wherein the support member further comprises a stopping structure located at a side of the support member away from an elastic pushing structure of the support member.

12. The electronic device according to claim 9, wherein the holding structure is movably connected to the frame bottom plate via the elastic arm portion.

13. The electronic device according to claim 12, wherein the holding structure of the elastic holder comprises a stopping surface facing towards an elastic pushing structure of the support member.

14. The electronic device according to claim 12, wherein the holding structure of the elastic holder comprises a contacting surface which is located at a side of the holding structure away from an elastic pushing structure of the support member and is inclined relatively to the frame bottom plate.

15. The electronic device according to claim 9, wherein the holding structure is movably connected to the frame bottom plate via the elastic arm portion, the holding structure comprises a pushing surface, wherein the frame bottom plate has a first top surface and a second top surface facing a same direction, the partition is disposed on the first top surface of the frame bottom plate, the second top surface of the frame bottom plate is located farther away from the partition than the first top surface, when the holding structure is in a holding position, a distance between the pushing surface of the elastic holder and the second top surface of the frame bottom is D1, a distance between the supporting surface of the support member and the second top surface of the frame bottom is D2, D1>D2, and the backplane is selectively adjoined to the engagement structure of the partition.

16. The electronic device according to claim 9, wherein the casing assembly further comprises a handle member movably connected to the frame bottom plate via the elastic holder.

17. The electronic device according to claim 9, wherein the elastic holder is integrally formed with the support member.

* * * * *